(12) United States Patent
Edelstein et al.

(10) Patent No.: US 7,585,722 B2
(45) Date of Patent: Sep. 8, 2009

(54) INTEGRATED CIRCUIT COMB CAPACITOR

(75) Inventors: Daniel C. Edelstein, White Plains, NY (US); Anil K. Chinthakindi, Wappingers Falls, NY (US); Timothy J. Dalton, Ridgefield, CT (US); Ebenezer E. Eshun, Newburgh, NY (US); Jeffrey P. Gambino, Westford, VT (US); Sarah L. Lane, Wappingers Falls, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 11/306,746

(22) Filed: Jan. 10, 2006

(65) Prior Publication Data

US 2007/0158717 A1   Jul. 12, 2007

(51) Int. Cl.
    *H01L 29/00*   (2006.01)
(52) U.S. Cl. .................... 438/239; 438/393
(58) Field of Classification Search ............. 438/171, 438/190, 210, 238–258, 329, 381, 386, 387, 438/393–399
See application file for complete search history.

(56) References Cited

U.S. PATENT DOCUMENTS

| | | | |
|---|---|---|---|
| 6,426,304 B1* | 7/2002 | Chien et al. ............... 438/727 |
| 6,495,877 B1* | 12/2002 | Hsue et al. ................. 257/306 |
| 6,656,785 B2* | 12/2003 | Chiang et al. .............. 438/240 |
| 6,690,570 B2 | 2/2004 | Hajimiri et al. |
| 6,819,540 B2* | 11/2004 | Allen et al. ................. 361/302 |
| 2004/0041239 A1* | 3/2004 | Ruelke et al. .............. 257/637 |
| 2005/0124131 A1* | 6/2005 | Hweing et al. ............. 438/381 |
| 2005/0272218 A1* | 12/2005 | Park et al. .................. 438/386 |
| 2007/0029611 A1* | 2/2007 | Phan et al. ................. 257/347 |

OTHER PUBLICATIONS

Application of an SOI 0.12 um CMOS Technology to SoCS With Low-Power and High-Frequency Circuits, Plouchart, et al., IBM J. Res. & Dev. vol. 47 No. 5/6 Sep./Nov. 2003, pp. 611-629.

* cited by examiner

*Primary Examiner*—Cuong Q Nguyen
(74) *Attorney, Agent, or Firm*—Lisa U. Jaklitsch

(57) ABSTRACT

The invention is directed to an integrated circuit comb capacitor with capacitor electrodes that have an increased capacitance between neighboring capacitor electrodes as compared with other interconnects and via contacts formed in the same metal wiring level and at the same pitches. The invention achieves a capacitor that minimizes capacitance tolerance and preserves symmetry in parasitic electrode-substrate capacitive coupling, without adversely affecting other interconnects and via contacts formed in the same wiring level, through the use of, at most, one additional noncritical, photomask.

22 Claims, 9 Drawing Sheets

INTEGRATED CIRCUIT COMB CAPACITOR

BACKGROUND OF THE INVENTION

Field of the Invention

As ULSI integrated circuits scale to smaller dimensions and increased function and circuit density, many electronic functions that were formerly off-chip are now being incorporated on-chip. These then take advantage of fabrication economies as well as reduced electrical signaling distances to become cheaper and add higher system function and higher performance. One family of devices that has been the focus of increased innovation for on-chip integration is BEOL passive devices. Although interconnects themselves are, strictly speaking, also passive devices, that term is conventionally applied to other passive electronic devices such as resistors, capacitors, inductors, and varactors. Although resistors and capacitors have always been integrated in the FEOL for transistor logic circuits, those FEOL passive devices suffer from voltage nonlinearities and unwanted parasitic impedances that render them not useful for many types of analogue circuits such as for RF or wireless applications. Inductors in general can only obtain useful parameters when integrated in the BEOL wiring levels.

For BEOL capacitors, the most common type of device is the planar metal-insulator-metal (MIM) parallel plate capacitor. This requires one or more added photomask levels to fabricate lower and upper electrode plates, the capacitor dielectric, and contacts to the plates. These are usually distinct from other interconnects and via contacts formed in the same wiring level. The disadvantages of MIM capacitors is the number of added masks and process steps, the asymmetry in parasitic capacitive coupling to the substrate of the upper and lower electrodes, the limited dielectric reliability at the small thicknesses needed for sufficient capacitance density, and the chip real-estate occupied which often requires exclusion of wiring from areas directly below the MIM capacitor.

Another type of BEOL capacitor is the interdigitated comb-comb type; this is comprised of multiple line-to-line capacitor fingers connected in parallel (so their capacitances add) with alternating bias between each pair of lines. The devices rely on standard wiring sidewall depths and minimum interline spacings to maximize their capacitances. These dimensions are such that a single-level comb-comb capacitance density is much smaller per unit layout area than what is possible with the MIM capacitors, and as well the typically larger dimensional deviations associated with the interconnect thicknesses and spacings may make it more challenging to meet design specifications. On the other hand, the interdigitated integrated circuit comb capacitor requires no additional photomasks or processing steps (as long as the same interline dielectric is used) and has no asymmetry in parasitic coupling to the substrate for the two electrodes.

FIG. 1 shows an integrated circuit comb capacitor 150 created in accordance with the prior art. Therefore, in accordance with the prior art, the capacitor electrodes 150a have the same depth and spacing between neighboring capacitor electrodes 150a as interconnects 160 formed in the same wiring level. The capacitor is preferably made from copper damascene embedded in a low-k dielectric ($\in$) material 102 such as SiCOH organosilicate glass. The capacitor electrodes 150a are characterized by their lengths (into/out of page), widths, depths, spacings, and if trapezoidal, their sidewall angles ($\alpha$). When energized as in an active IC circuit, the successive electrodes 150a are typically biased in an alternating sense such as Vdd (+) and Ground (−) or with an AC signal to perform the capacitor function.

More recently, an enhancement to the integrated circuit comb capacitor 150 has been described which solves some of the aforementioned problems. Called the vertical parallel plate (VPP) capacitor, this is comprised of multilevel stacks of interdigitated integrated circuit comb capacitors 150. With VPP capacitors, areal capacitance densities equal those of the MIM devices, there are still no added photomasks or processing steps, and there is still no asymmetry in parasitics for both electrodes. In addition, when multiple levels are combined, the statistical variations in linewidth and spacing dimensions tend to average out so that more uniform results, better matching, and tighter tolerances may be obtained from chip to chip and wafer to wafer. The disadvantage is the number of levels and layout area required to achieve a given capacitance.

This disadvantage becomes larger for integration of the VPP capacitor in modern low-k BEOL levels, where capacitance density decreases directly in proportion to the decrease in the interline and interlevel dielectric constants. This disadvantage does not apply to the MIM case which uses a separate capacitor dielectric. However, the other disadvantages of the MIM capacitor remain for integration in low-k BEOL. In addition, with CMOS scaling driving reductions in all wiring dimensions, the interlevel BEOL vertical spacings decrease while the MIM thickness does not, such that fabrication becomes difficult or impossible due to excessive topography over the MIM areas. Given the above discussion, there is still a need to obtain larger capacitance densities especially for low-k BEOL integrated capacitors, while adding minimal masking levels, minimizing capacitance tolerances, and preserving symmetry in electrode-substrate coupling parasitics.

What is needed in the art is an improved low-k BEOL integrated circuit comb capacitor, which minimizes capacitance tolerances and preserves symmetry in parasitic electrode-substrate coupling and that is created with a minimum of additional masking levels or process steps.

BRIEF SUMMARY OF THE INVENTION

The invention is directed to a method and structure. More specifically, the method of the invention is directed to a method for creating a capacitor that comprises a forming and modifying step. The forming step comprises forming a capacitor opening and a non-capacitor opening in dielectric, while the modifying step comprises modifying the dielectric along the surfaces of the capacitor opening such that the modification increases the capacitance of the capacitor. More specifically, the structure of the invention is directed to a capacitor that comprises non-capacitor and capacitor openings. The non-capacitor openings are formed in dielectric and have a prescribed spacing between nearest neighboring non-capacitor openings in same metal line level, while the capacitor openings formed in the dielectric in the same metal line level as the non-capacitor openings have a spacing between nearest neighboring capacitor openings that is less than the prescribed spacing between nearest neighboring non-capacitor openings.

A first embodiment of the invention is directed to a method for creating a capacitor, comprising the steps of depositing, forming, protecting, creating, expanding, and filling. The depositing step comprises depositing a low-k dielectric. The forming step comprises forming openings in the low-k dielectric with at least one opening comprising a non-capacitor opening and at least one opening comprising a capacitor opening. The protecting step comprises protecting any non-capacitor opening from dielectric constant modification. The creating step comprises creating a porous region along surfaces of the capacitor opening. The expanding step comprises expanding at least one capacitor opening by selectively removing the modified dielectric along the surfaces of the capacitor opening. The filling step comprises filling the non-capacitor opening and the expanded capacitor opening with a conductive material.

A second embodiment of the invention is directed to method for creating a capacitor, comprising the steps of depositing, removing, forming, protecting, and infusing. The depositing step comprises depositing a low-k dielectric comprising a dielectric matrix and porogen. The removing step comprises removing porogen from the low-k dielectric. The forming step comprises forming openings in the porous dielectric with at least one opening comprising a non-capacitor opening and at least one opening comprising a capacitor opening. The protecting step comprises protecting any non-capacitor opening from dielectric constant modification. The infusing step comprises infusing the porous dielectric along the surfaces of the capacitor opening with a material having a dielectric constant higher than the dielectric constant of the porous dielectric prior to the infusion.

A third embodiment of the invention is directed to a method for creating a capacitor, comprising the steps of depositing, forming, protecting, infusing, filling, and removing. The depositing step comprises depositing a low-k dielectric comprising a porogen. The forming step comprises forming openings in the low-k dielectric with at least one opening a non-capacitor opening and at least one opening a capacitor opening. The protecting step comprises protecting any non-capacitor opening from dielectric constant fluctuation. The infusing step comprises infusing the porous dielectric along surfaces of the at least one capacitor opening with a material having a dielectric constant higher than the dielectric constant of the porous dielectric prior to infusion. The filling step comprises filling the non-capacitor and capacitor openings with a conductive material. The removing step comprises removing porogen from the low-k dielectric.

The invention is directed to an integrated circuit comb capacitor with capacitor electrodes that have a reduced spacing between neighboring capacitor electrodes as compared with other interconnects and via contacts formed in the same metal wiring level. The invention creates an integrated circuit comb capacitor with higher capacitance density than prior art integrated circuit comb capacitors with the use of at most one additional, noncritical photomask.

For at least the foregoing reasons, the invention improves upon integrated circuit comb capacitors.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

Figure 1:
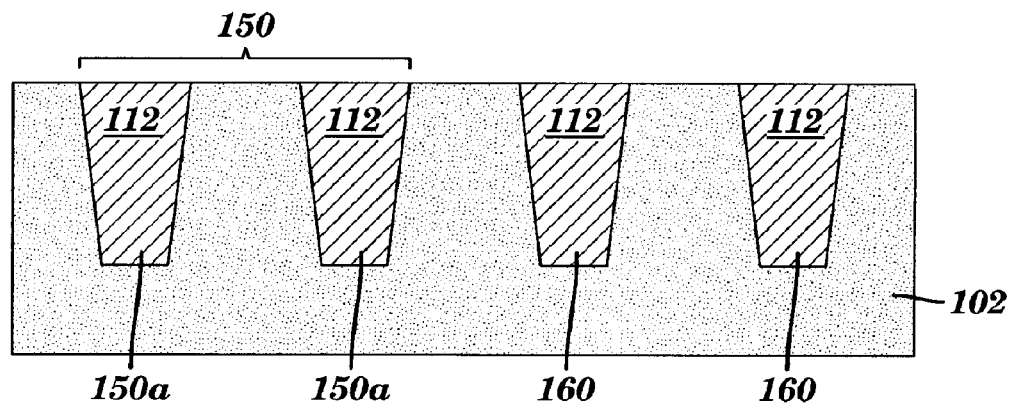
FIG. 1 depicts a prior art integrated circuit comb capacitor 150.

The invention will now be described with reference to the accompanying figures. In the figures, various aspects of the structures have been depicted and schematically represented in a simplified manner to more clearly describe and illustrate the invention.

By way of overview and introduction, the invention is directed to an integrated circuit comb capacitor with capacitor electrodes that have a reduced spacing between neighboring capacitor electrodes as compared with other interconnects and via contacts formed in the same metal wiring level. All embodiments of the invention comprise formation of capacitor openings and modifying the dielectric along the surfaces of the capacitor openings such that the modification results in a capacitor with increased capacitance density.

A first embodiment of the invention will be described with reference to the FIGS. 2a-2e, which depict the formation of an improved capacitor, and more specifically an improved integrated circuit comb capacitor 250. The first embodiment is described generally as creating a modified dielectric 204 along the surfaces of the capacitor openings 220 formed in low-k dielectric 102, removing the modified dielectric 204 along the surfaces of the capacitor openings 220, and filling the capacitor openings 220 with a conductive material 112. The first embodiment is described more specifically herein below with reference to FIGS. 2a-2e, individually.

Figure 2A:
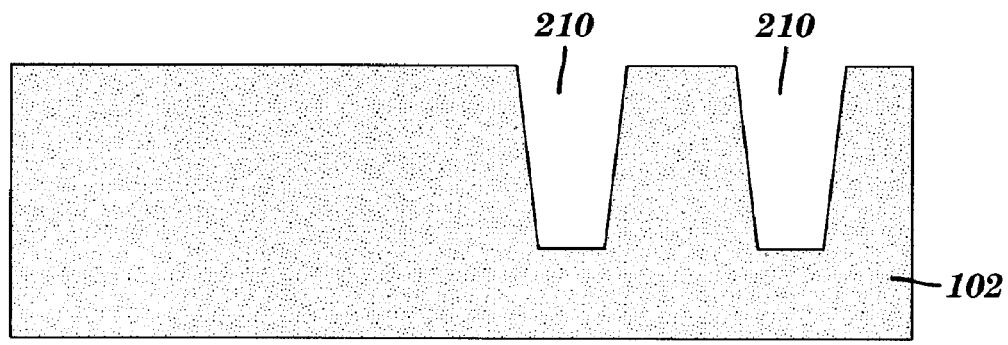
FIGS. 2a-2e depict the formation of an integrated circuit comb capacitor 250 in accordance with a first embodiment of the invention.

FIG. 2a depicts the formation of single damascene non-capacitor openings 210, which are formed for non-capacitor wiring in low-k dielectric 102. Preferably, the low-k dielectric 102 comprises one of SiCOH or porous SiCOH. While not depicted, dual damascene non-capacitor openings 210 could also be formed in the low-k dielectric 102. Dual damascene non-capacitor openings 210 would comprise an interconnect and via portion.

Figure 2B:
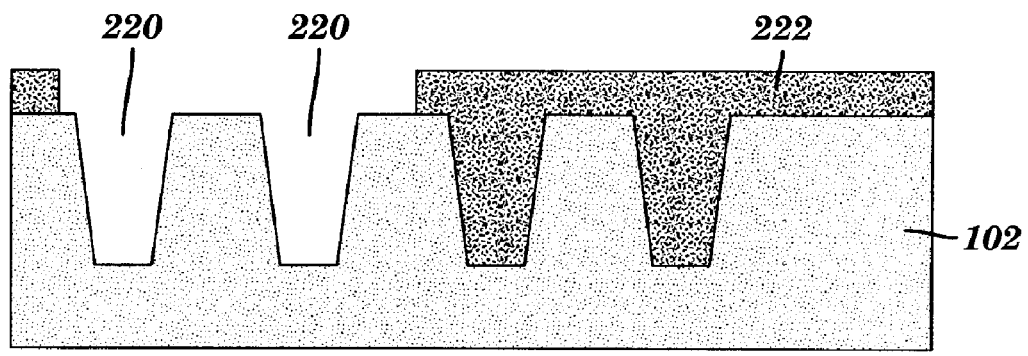

FIG. 2b depicts the formation of single damascene capacitor openings 220 in low-k dielectric 102, while a block mask 222, protects the non-capacitor openings 210. As with the non-capacitor openings 210, while a single damascene capacitor opening 220 is depicted in FIG. 2b, dual damascene capacitor openings 220 could also be formed in the low-k dielectric 102. Dual damascene capacitor openings 220 would comprise an interconnect and via portion. Both the non-capacitor openings 210 and the capacitor openings 220 are formed by conventional photomask and etching steps. While FIGS. 2a-2b depict the formation of non-capacitor openings 210 and capacitor openings 220 in two steps, the non-capacitor opening 210 and the capacitor openings 220 could be formed in the low-k dielectric 102 in one step with the same photomask.

Figure 2C:
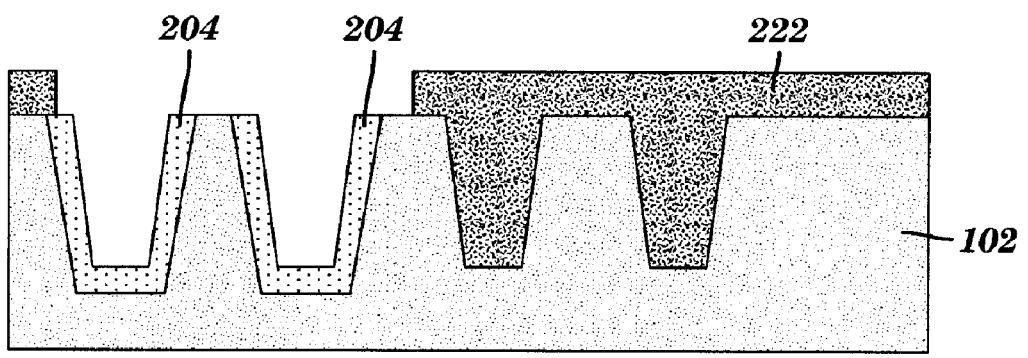

FIG. 2c depicts modifying the low-k dielectric 102 along the surfaces of capacitor openings 220. More specifically, a chemically and/or physically modified dielectric 204 is created along the surfaces of the capacitor openings 220. The modified dielectric 204 is created by depleting carbon and possibly oxidizing the remaining material from surfaces of the capacitor openings 220. Generally, carbon is depleted with the wafer at room temperature in a reactive ion etch tool with activation of either an oxidizing plasma, such as $O_2$, $N_2O$, or $H_2O$, or a reducing plasma, such as $N_2/H_2$ or $H_2$. Further modification, by oxidation of the remaining material, occurs in an oxidizing plasma. Following modification, the modified dielectric 204 results in a porous $SiO_2$-like material. The low-k dielectric 102 may have a dielectric constant less than or approximately equal to 3.0, while the modified dielectric 204 has a dielectric constant greater than 4.0. Although the modified dielectric 204 has the property of a higher dielectric constant, which is advantageous from an increased capacitive density perspective, this material also poor dielectric breakdown, high electrical leakage, and high water absorption, which is disadvantageous from performance and reliability perspectives. Therefore, as depicted in FIG. 2d, the modified dielectric 204 is selectively removed.

Figure 2D:
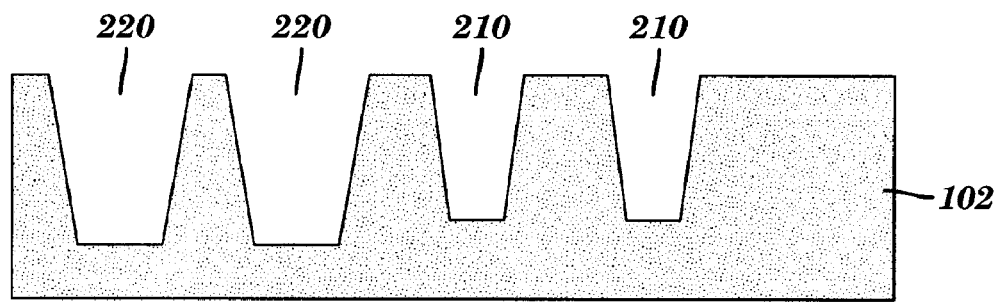

FIG. 2d depicts the selective removal of the modified dielectric 204 from the surfaces of the capacitor openings. The block mask 222 has been removed, which therefore exposes the non-capacitor openings to etch processing. The modified dielectric 204 etches more quickly in a typical solution such as a diluted hydrofluoric acid (DHF), e.g. 100:1 $H_2O$:HF, than the low-k dielectric 102 etches. The disparate etch rates results in a modified capacitor opening 220 that is deepened and widened such that there are reduced spacings between neighboring capacitor openings 220 as compared with other interconnects and via contacts formed in the same metal wiring level and reduced vertical spacings between the bottom of the wiring level and any conductors within the substrate. As discussed herein above, the capacitance of the integrated circuit comb capacitor 250 increases with the modified depth and width of the capacitor electrodes 250a, which decreases the spacing between capacitor electrodes 250a. After the modified dielectric 204 has been removed, the integrated circuit comb capacitor 250 will be metalized, planarized and capped. The final integrated circuit comb capacitor 250 is depicted in FIG. 2e.

Figure 2E:
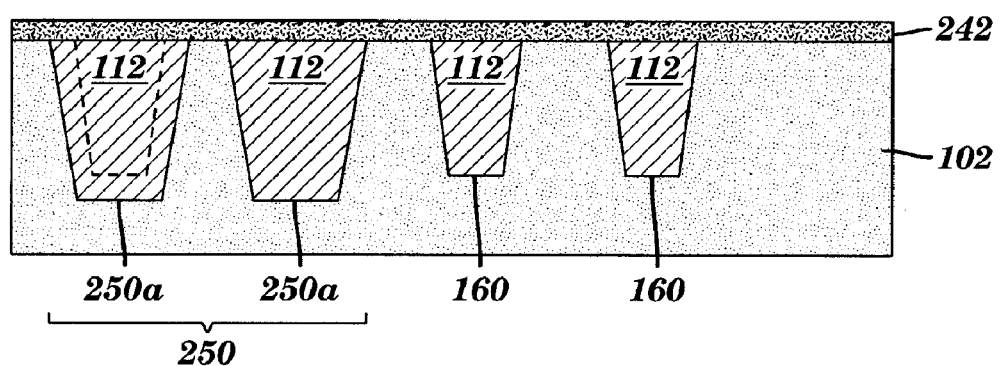

FIG. 2e depicts the capacitor of the first embodiment of the invention, namely a capacitor with capacitor electrodes 250a that are deepened and widened such that there are reduced spacings between neighboring capacitor electrodes 250a than as compared with other interconnects 160 and via contacts formed in the same metal wiring level. A conductive material 112, i.e. copper, fills the modified capacitor openings 220 and the non-capacitor openings 210. Thereafter, the capacitor electrodes 250a and interconnects 160 are planarized and capped 242.

Figure 3:
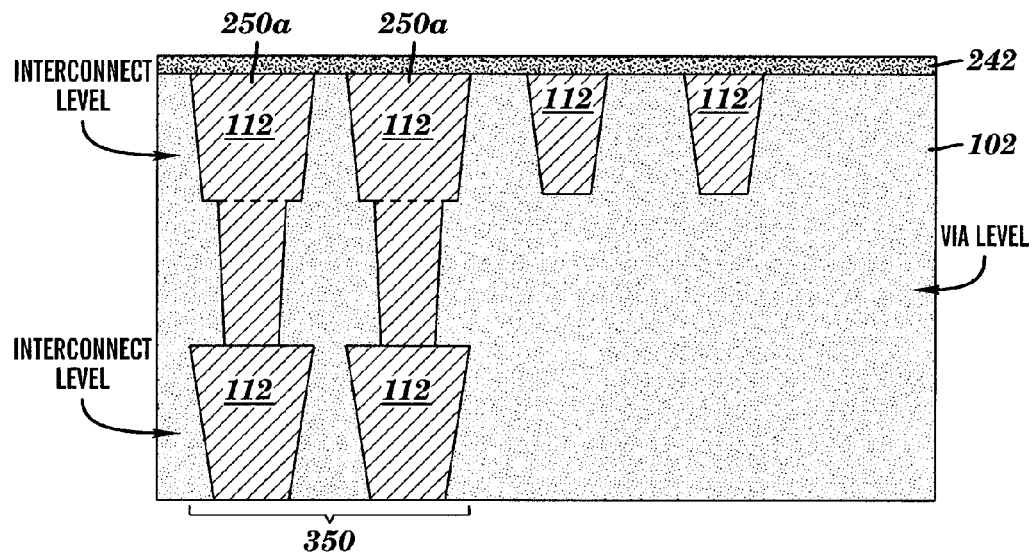
FIG. 3 depicts a VPP capacitor in accordance with the first embodiment of the invention.

FIG. 3 depicts a VPP capacitor in accordance with the first embodiment of the invention depicted in FIGS. 2a-2e. As described above, a VPP capacitor is comprised of multilevel stacks of integrated circuit comb capacitors 250. In FIG. 3, each integrated circuit comb capacitor 350 in the multilevel stack has been created in accordance with the first embodiment of the invention. While FIGS. 2a-2e depict a single damascene capacitor, FIG. 3 depicts a dual damascene capacitor. The dual damascene capacitor depicted in FIG. 3 comprises an interconnect and via portion created in accordance with a first embodiment of the invention. Therefore, the capacitor electrodes 250a are deepened and widened such that there are reduced spacings between neighboring capacitor electrodes 250a as compared with other interconnects and via contacts formed in the same metal wiring level. While not depicted in FIG. 3, a VPP capacitor could also be comprised of stacks of single damascene integrated circuit comb capacitors.

Figure 4:
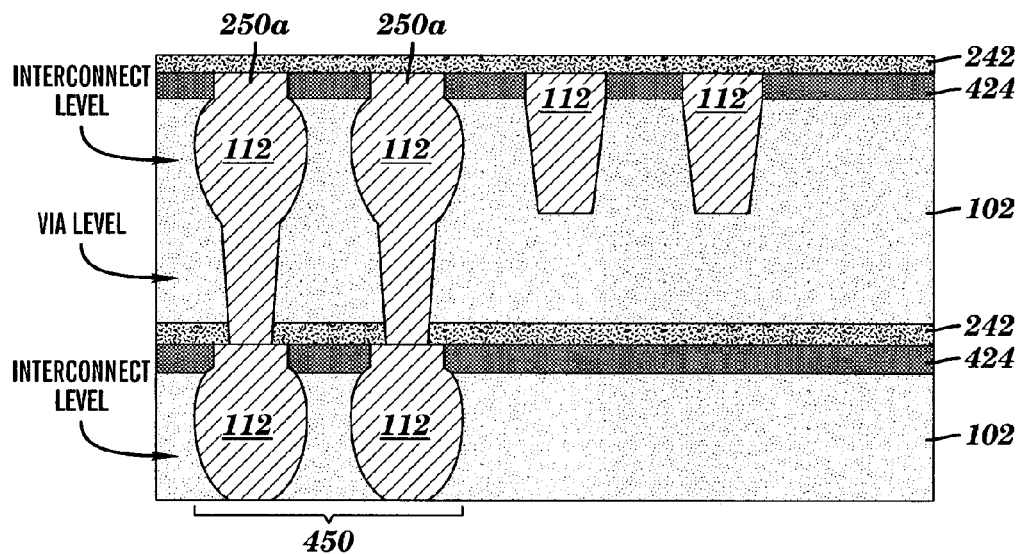
FIG. 4 depicts a modified version of the VPP capacitor in FIG. 3.

FIG. 4 depicts a modified version of the VPP capacitor in FIG. 3. The VPP capacitor of FIG. 4 differs from the VPP capacitor of FIG. 3 in that after removal of the modified dielectric 204 (not shown), but prior to deposition of a conductive material 112 a further step is performed. More specifically, an etch or chemical-mechanical planarization (CMP) hard mask 424 is used to create a VPP capacitor with a bulging shape 450. The bulging shape creates a VPP capacitor with a maximum minimum spacing between neighboring capacitor electrodes 250a occurring towards the midpoint of the capacitor electrodes 250a as depicted in FIG. 4, as opposed to the top of the capacitor electrodes 250a as depicted in FIGS. 2e and 3. A maximum minimum spacing occurring towards the midpoint of the neighboring capacitor electrodes 250a as opposed to the top of the neighboring capacitor electrodes 250a could have advantages from a reliability perspective to the extent that process induced leakage paths occur at the interface with the cap 242.

FIGS. 5a-5e depict the formation of an integrated circuit comb capacitor 550 in accordance with a second embodiment of the invention. Unlike the first embodiment, in the second embodiment the modified dielectric 204 along the surfaces of the capacitor openings 220 is not removed, but instead infused with a high-k dielectric 506. The second embodiment is described more specifically herein below with reference to FIGS. 5a-5e, individually.

Figure 5A:
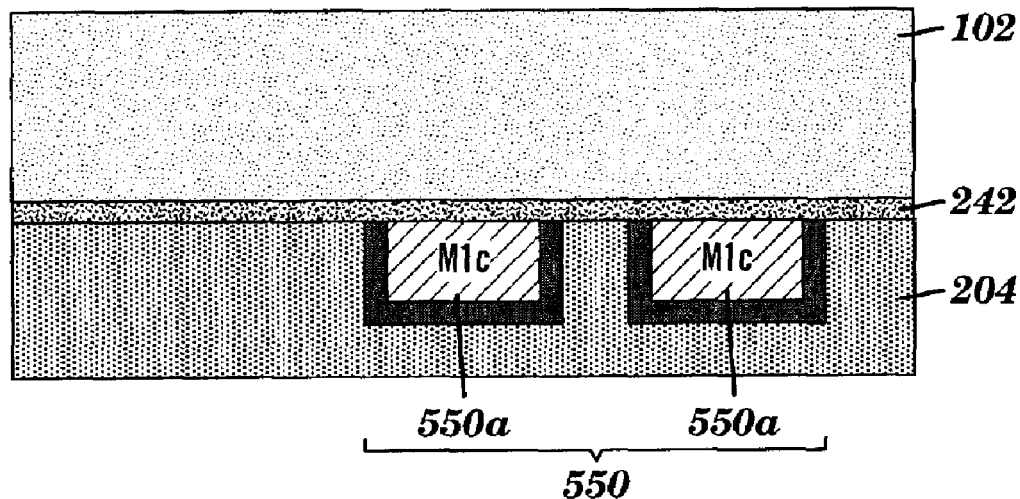
FIGS. 5a-5e depict the formation of an integrated circuit comb capacitor 550 in accordance with a second embodiment of the invention.

FIG. 5a depicts a low-k dielectric 102 deposited on a capping layer 242. Beneath the capping layer 242, capacitor electrodes 550a preexist.

Figure 5B:
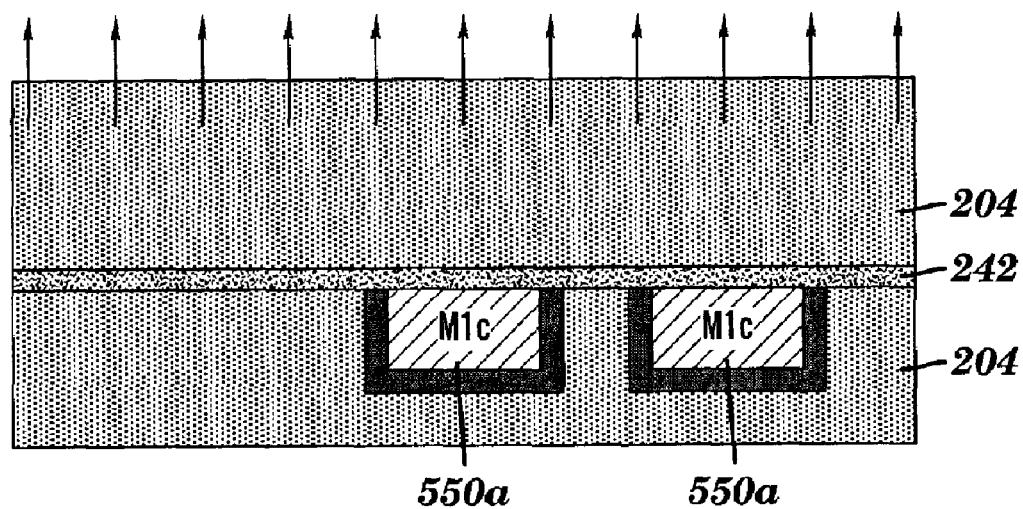

FIG. 5b depicts modifying the low-k dielectric. The modification creates a porous material 204. Similar to the first embodiment of the invention, the second embodiment of the invention creates a porous material 204, however unlike the first embodiment of the invention, in the second embodiment of the invention the porous material 204 is not limited to the surfaces of the capacitor openings 220.

Figure 5C:
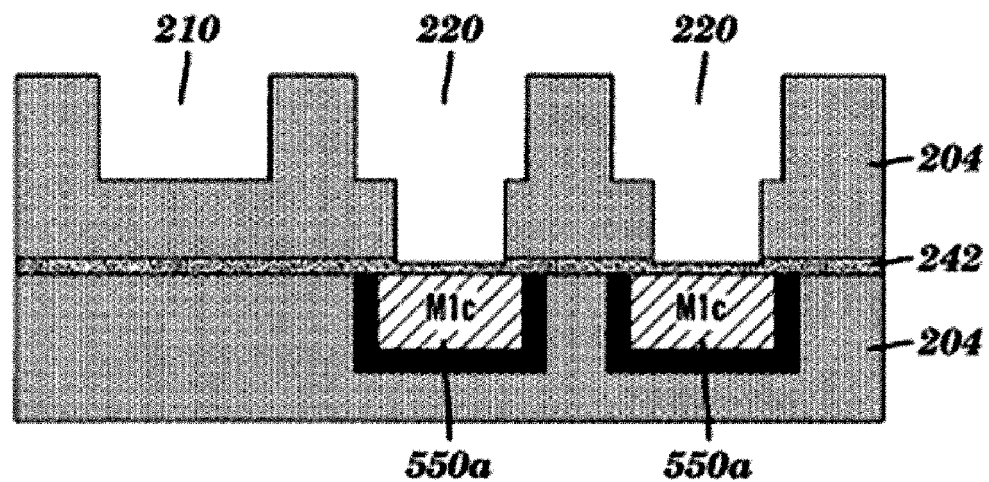

FIG. 5c depicts the formation of non-capacitor openings 210 and capacitor openings 220 in the modified dielectric 204. While in FIG. 5c, the non-capacitor openings 210 and capacitor openings 220 are formed in one step with the same photomask. The non-capacitor openings 210 and capacitor openings 220 could also be formed in two steps as was previously described herein above with reference to FIGS. 2a-2b. Dual damascene capacitor openings 220 are shown in FIG. 5c. Therefore, the capacitor openings 220 comprises an interconnect and a via portion.

Figure 5D:
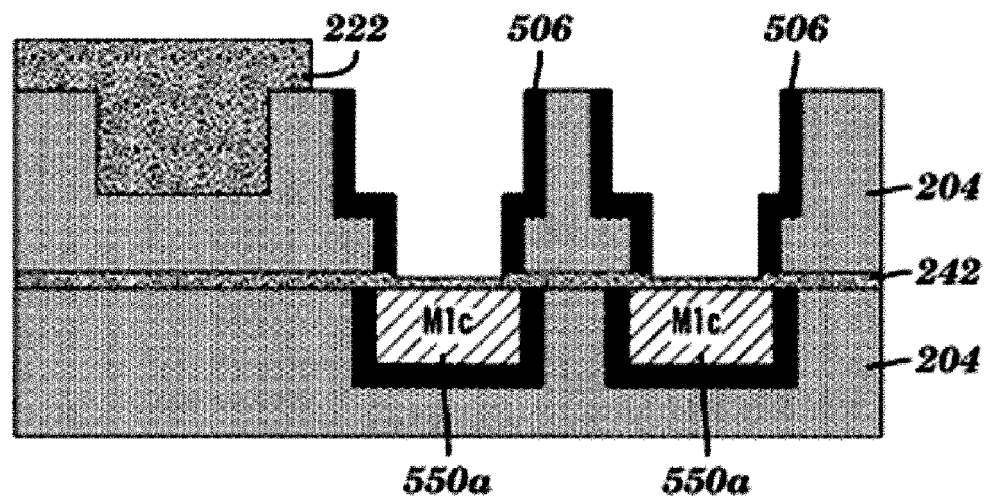

FIG. 5d depicts modifying the modified dielectric 204 along the surfaces of the capacitor openings 220. Once again, the non-capacitor openings 222 are protected with a block mask 222. As mentioned herein above, unlike the first embodiment of the invention in the second embodiment of the invention, the modified dielectric 204 is not removed, but instead infused with a high-k dielectric 506. The high-k dielectric 506 has a higher dielectric constant than the modified dielectric 204.

Figure 5E:
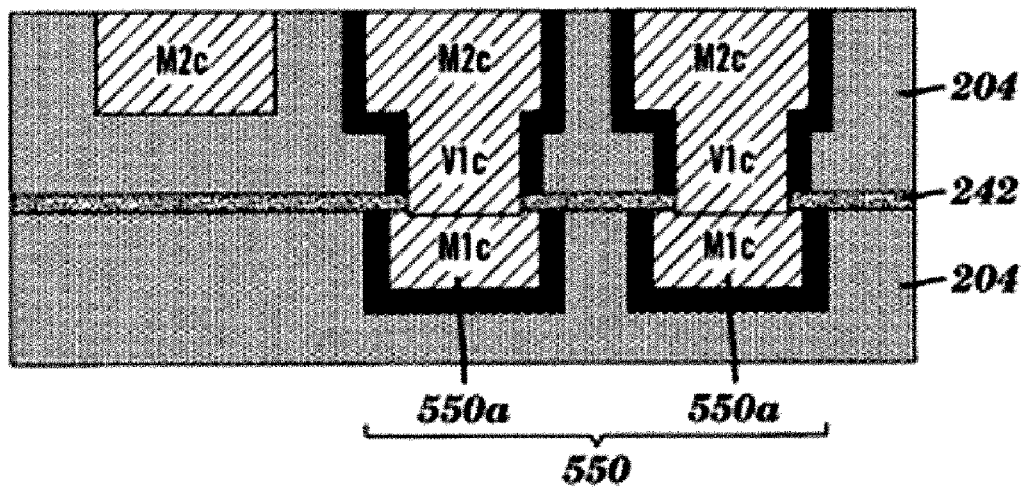

FIG. 5e depicts filling the non-capacitor opening 210 and modified non-capacitor openings 220 with a conductive material 112.

FIGS. 6a-6e depict the formation of an integrated circuit comb capacitor 650 in accordance with a third embodiment of the invention. Similar to the second embodiment of the invention, in the third embodiment of the invention the modified dielectric 204 along the surfaces of the capacitor openings 220 is not removed but instead infused with a high-k dielectric 506. Unlike the second embodiment of the invention, in the third embodiment of the invention the modified dielectric 204 is created after the non-capacitor openings 210 and capacitor openings 220 are filled with a conductive material 112. The third embodiment is described more specifically herein below with reference to FIGS. 6a-6e, individually.

Figure 6A:
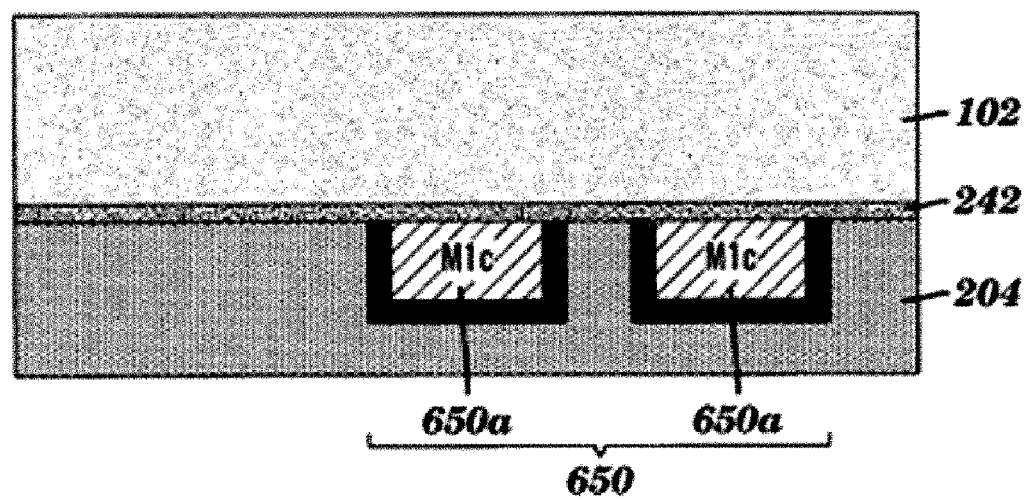
FIGS. 6a-6e depict the formation of an integrated circuit comb capacitor 550 in accordance with a third embodiment of the invention.

FIG. 6a depicts a low-k dielectric 102 deposited on a capping layer 242. Beneath the capping layer 242 preexists capacitor electrodes 550a created in accordance with the second embodiment of the invention.

Figure 6B:
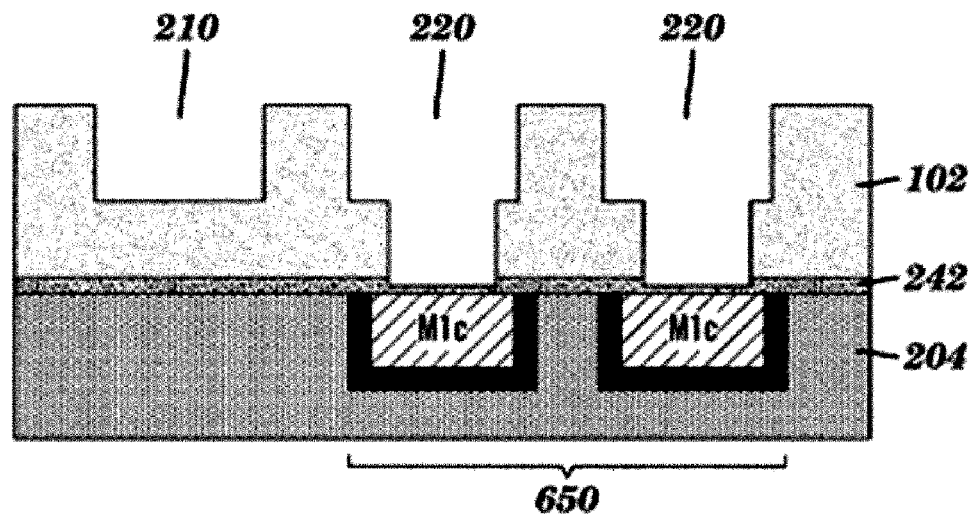

FIG. 6b depicts forming non-capacitor opening 210 and capacitor openings 220 in low-k dielectric 102. Unlike in the second embodiment of the invention, the low-k dielectric 102 is not modified, prior to the formation of the non-capacitor opening 210 and capacitor openings 220.

Figure 6C:
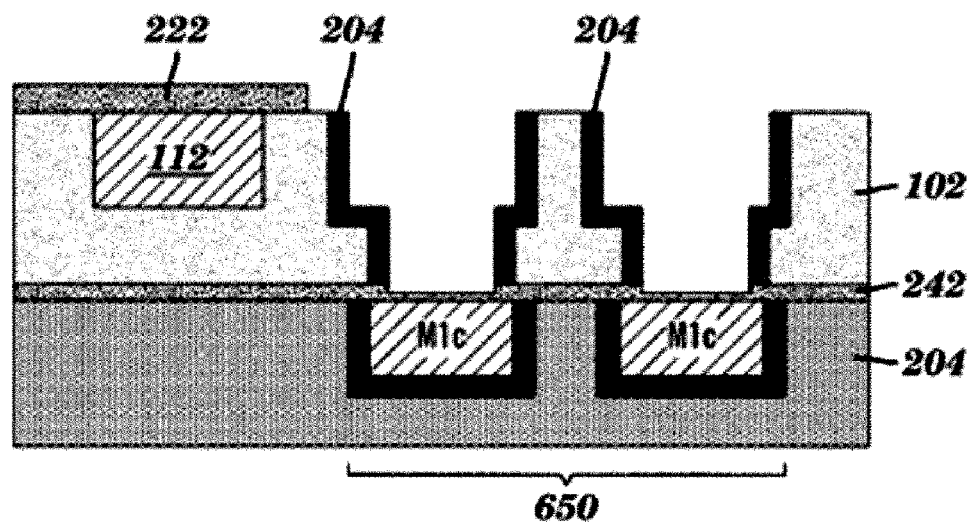

FIG. 6c depicts modifying the dielectric 204 along the surfaces of the capacitor openings 220. This step of the third embodiment of the invention is similar to the step depicted in FIG. 2c of the first embodiment of the invention. In both the third and first embodiments of the invention, a block mask 222 protects the non-capacitor openings in the low-k dielectric 102, while modifications are made along the surfaces of the capacitor openings 220. The modifications create a porous material 204 along the surfaces of the capacitor openings 220. Unlike the first embodiment, but similar to the second embodiment, the modified dielectric 204 is not removed in the third embodiment.

Figure 6D:
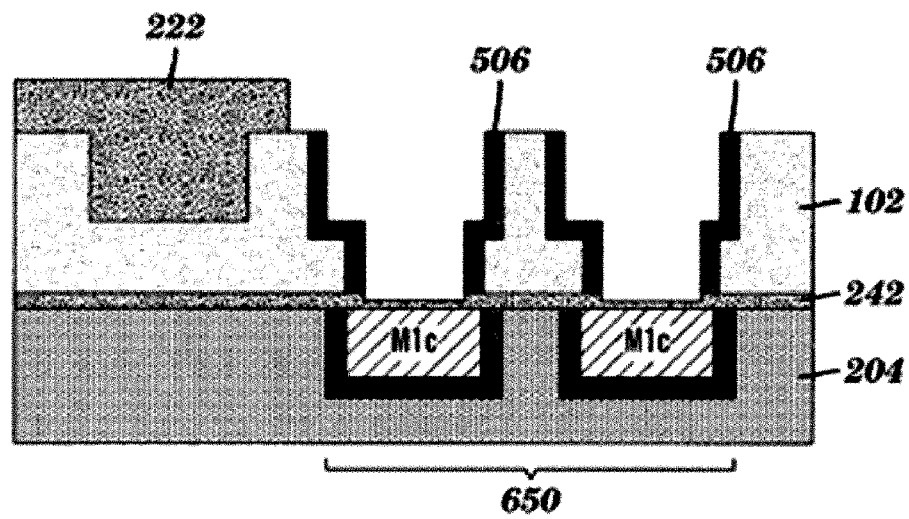

FIG. 6d depicts modifying the modified dielectric 204 along the surfaces of the capacitor openings 220. Once again, the non-capacitor openings 222 are protected with a block mask 222. As mentioned herein above, unlike the first embodiment, the modified dielectric 204 is not removed, but similar to the second embodiment, the modified dielectric 204 is infused with a high-k dielectric 506. The high-k dielectric 506 has a higher dielectric constant than the modified dielectric 204.

Figure 6E:
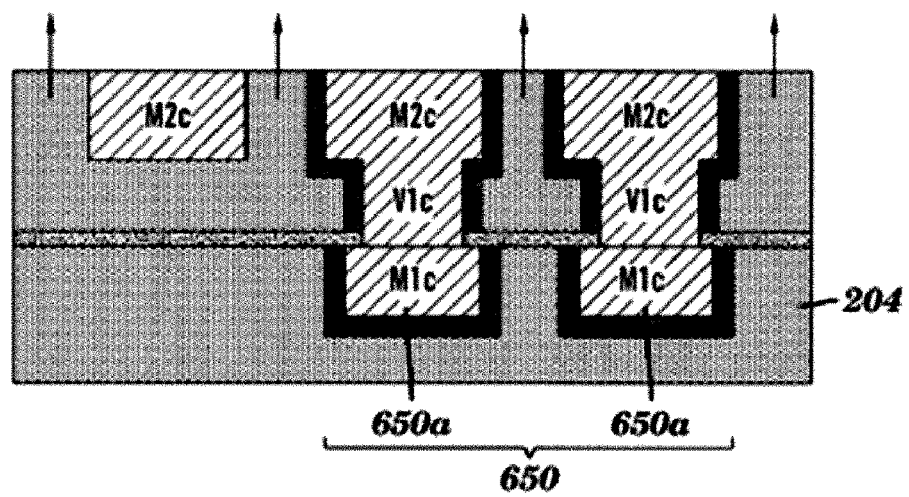

FIG. 6e depicts filling the non-capacitor opening 210 and modified non-capacitor openings 204 with a conductive material 112, and removing porogen from low-k dielectric 102. Unlike the second embodiment of the invention, in the third embodiment of the invention the porogen is removed from the low-k dielectric 102 after formation of the non-capacitor openings 210 and capacitor openings 220.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A method for creating a capacitor, comprising the steps of:
    depositing a low-k dielectric;
    forming a plurality of openings with same pitch in said low-k dielectric at a same metal wiring level, at least one opening a non-capacitor opening and at least one opening a capacitor opening;
    protecting any non-capacitor opening from dielectric constant modification;
    creating a porous region along surfaces of said at least one capacitor opening;
    expanding said at least one capacitor opening by selectively removing said modified dielectric along said surfaces of said at least one capacitor opening; and,
    filling said non-capacitor opening and said expanded capacitor opening with a conductive material.

2. A method as in claim 1, said low-k dielectric is SiCOH.

3. A method as in claim 1, said modified dielectric along said surfaces of said at least one capacitor opening removed with a diluted hydrofluoric acid.

4. A method as in claim 1, said creating step comprising depleting carbon from said surfaces of said at least one capacitor opening.

5. A method as in claim 4, said depleting comprising activating an oxidizing plasma, said activating plasma one of $O_2$, $N_2O$, and $H_2O$.

6. A method as in claim 4, said depleting step comprising activating a reducing plasma, said reducing plasma one of $N_2/H_2$ and $H_2$.

7. A method for creating a capacitor, comprising the steps of:
    depositing a low-k dielectric comprising a dielectric matrix and porogen;
    removing said porogen from said low-k dielectric;
    forming a plurality of openings in said porous dielectric at same metal wiring level with same pitch, at least one opening a non-capacitor opening and at least one opening a capacitor opening;
    protecting any non-capacitor opening from dielectric constant modification; and,
    infusing said porous dielectric along surfaces of said capacitor opening with a material having a dielectric constant higher than said dielectric constant of said porous dielectric prior to said infusion.

8. A method as in claim 7, said removing step comprising: depleting carbon from said low-k dielectric.

9. A method as in claim 7, said low-k dielectric comprises SiCOH.

10. A method as in claim 7, said low-k dielectric having a dielectric constant less than 3.0, said porous dielectric with a dielectric constant between 4.0 and 5.0.

11. A method as in claim 7, said porous dielectric infused by one of one of PVD, CVD, IPVD, and ALD.

12. A method as in claim 7, said material comprises one of a metallic material and an insulating material.

13. A method as in claim 8, said depleting step comprising activating an oxidizing plasma, said activating plasma one of $O_2$, $N_2O$, and $H_2O$.

14. A method as in claim 8, said depleting step comprising activating a reducing plasma, said reducing plasma one of $N_2/H_2$ and $H_2$.

15. A method for creating a capacitor, comprising the steps of:
    depositing a low-k dielectric comprising a porogen;
    forming a plurality of openings with same pitch in said low-k dielectric at same metal wiring level, at least one opening a non-capacitor opening and at least one opening a capacitor opening;
    protecting any non-capacitor opening from dielectric constant fluctuation; and,
    infusing said porous dielectric along surfaces of said at least one capacitor opening with a material having a dielectric constant higher than said dielectric constant of said porous dielectric prior to said infusion;
    filling said non-capacitor and capacitor openings with a conductive material; and,
    removing porogen from said low-k dielectric.

16. A method as in claim 15, said removing step comprising:
    depleting carbon from said low-k dielectric.

17. A method as in claim 15, said low-k dielectric comprising SiCOH.

18. A method as in claim 15, said porous dielectric infused by one of one of PVD, CVD, IPVD, and ALD.

19. A method as in claim 15, said low-k dielectric having a dielectric constant less than 3.0, said porous dielectric with a dielectric constant between 4.0 and 5.0.

20. A method as in claim 15, said material comprises one of a metallic material and an insulating material.

21. A method as in claim 16, said depleting step comprising activating an oxidizing plasma, said activating plasma one of $O_2$, $N_2O$, and $H_2O$.

22. A method as in claim 16, said depleting step comprising activating a reducing plasma, said reducing plasma one of $N_2/H_2$ and $H_2$.

* * * * *

UNITED STATES PATENT AND TRADEMARK OFFICE
CERTIFICATE OF CORRECTION

PATENT NO. : 7,585,722 B2 Page 1 of 1
APPLICATION NO. : 11/306746
DATED : September 8, 2009
INVENTOR(S) : Edelstein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 583 days.

Signed and Sealed this

Fourteenth Day of September, 2010

David J. Kappos
*Director of the United States Patent and Trademark Office*